United States Patent [19]

Park

[11] Patent Number: 5,744,012
[45] Date of Patent: Apr. 28, 1998

[54] METHOD FOR FABRICATING SEMICONDUCTOR DEVICE

[75] Inventor: Hee Kook Park, Kyoungkido, Rep. of Korea

[73] Assignee: Hyundai Electronics Industries Co., Ltd., Rep. of Korea

[21] Appl. No.: 748,178

[22] Filed: Nov. 12, 1996

[30] Foreign Application Priority Data

Dec. 16, 1995 [KR] Rep. of Korea ............... 1995 50905

[51] Int. Cl.$^6$ .................................................. C23C 14/32
[52] U.S. Cl. .................... 204/192.34; 216/66; 216/67; 438/694; 438/720
[58] Field of Search ................ 156/643.1; 216/67, 216/66; 437/228; 204/192.34, 298.36; 438/694, 720, 721, 779

[56] References Cited

U.S. PATENT DOCUMENTS

| 4,463,255 | 7/1984 | Robertson et al. | 250/251 |
| 4,639,301 | 1/1987 | Doherty et al. | 204/192.31 |
| 4,976,843 | 12/1990 | Ward et al. | 204/298.36 |

Primary Examiner—R. Bruce Breneman
Assistant Examiner—Luz Alejandro
Attorney, Agent, or Firm—Blakely Sokoloff Taylor & Zafman

[57] ABSTRACT

A method for fabricating a semiconductor device wherein a plasma reaction is used to dry etch a film, comprising injection of anions onto the film to neutralize cations remaining on the film after the plasma etch, whereby the reliability in highly integrated semiconductor devices can be secured.

4 Claims, 2 Drawing Sheets

METHOD FOR FABRICATING SEMICONDUCTOR DEVICE

BACKGROUND OF THE INVENTION

1. Field of the Invention

The present invention relates, in general, to a method for fabricating a semiconductor device and, more particularly, to an improvement in process stability and uniformness through neutralization of the cations remaining on a film during plasma etch.

2. Description of the Prior Art

Dry etching used in the fabrication of semiconductor devices mostly depends on reactive ion etch techniques. According to the reactive ion etch techniques, etching gas is ionized into cations and anions, the former being generally used for the final patterns on wafers. However, there is generated a plasma antenna effect in that the cations are implanted in particular device parts on the surface of wafer causing deterioration in, for example, the gate oxide films of a transistor. This frequently has a fatal influence on the operation of a semiconductor device.

SUMMARY OF THE INVENTION

Therefore, it is an objective of the present invention to overcome the above problem encountered in the prior art and to provide a method for fabricating a semiconductor device, whereby cations remaining on a wafer surface after plasma dry etch are neutralized to prevent a current from being formed at a particular device portion.

The above objective could be accomplished by a provision of a method for fabricating a semiconductor wherein a plasma reaction is used to dry etch a film, comprising injection of anions onto the film to neutralize cations remaining on the film after the plasma etch.

BRIEF DESCRIPTION OF THE DRAWINGS

The above and other objectives and aspects of the invention will become apparent from the following description of embodiments with reference to the accompanying drawings in which.

DETAILED DESCRIPTION OF THE PREFERRED EMBODIMENT

Figure 1:
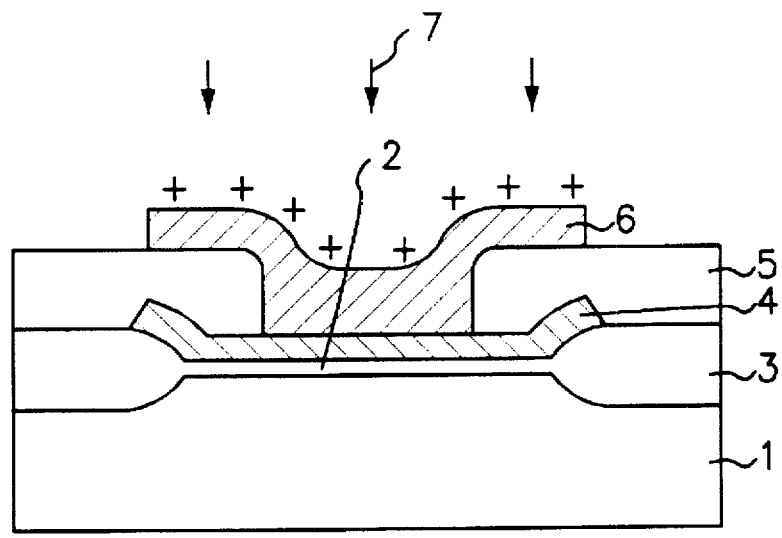
FIGS. 1 and 2 are schematic cross sectional views illustrating a method for fabricating a semiconductor device according to the present invention.

The application of the preferred embodiments of the present invention is best understood with reference to the accompanying drawings, wherein like reference numerals are used for like and corresponding parts, respectively.

Figure 2:
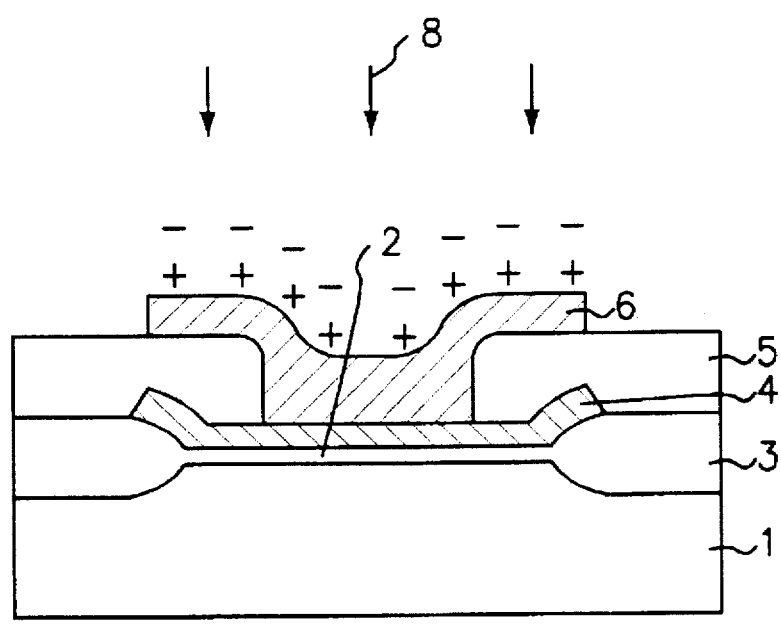

Referring to FIGS. 1 and 2, there is illustrated a method for fabricating a semiconductor device, according to the present invention.

First, a gate oxide film 2, a field oxide film 3, a gate electrode 4 and an interlayer insulating film 5 are, in sequence, formed over a silicon substrate 1, followed by bringing a conductive line 6 into contact with the gate electrode 4, as shown in FIG. 1. Then, the conductive line is patterned by an etch process using plasma 7.

During the plasma etch, positive charges are left on the surface of the conductive line 6, generating a potential. When this potential exceeds the breakdown voltage of the gate oxide film 2, a tunnelling effect is caused, deteriorating the oxide film.

FIG. 2 is a schematic view after an electron beam 8 (anions) is injected from an electron gun onto the wafer in a proper amount, to neutralize the positive charges present on the wafer, thereby preventing the tunnelling effect deteriorating the gate oxide film 2.

Figure 3:
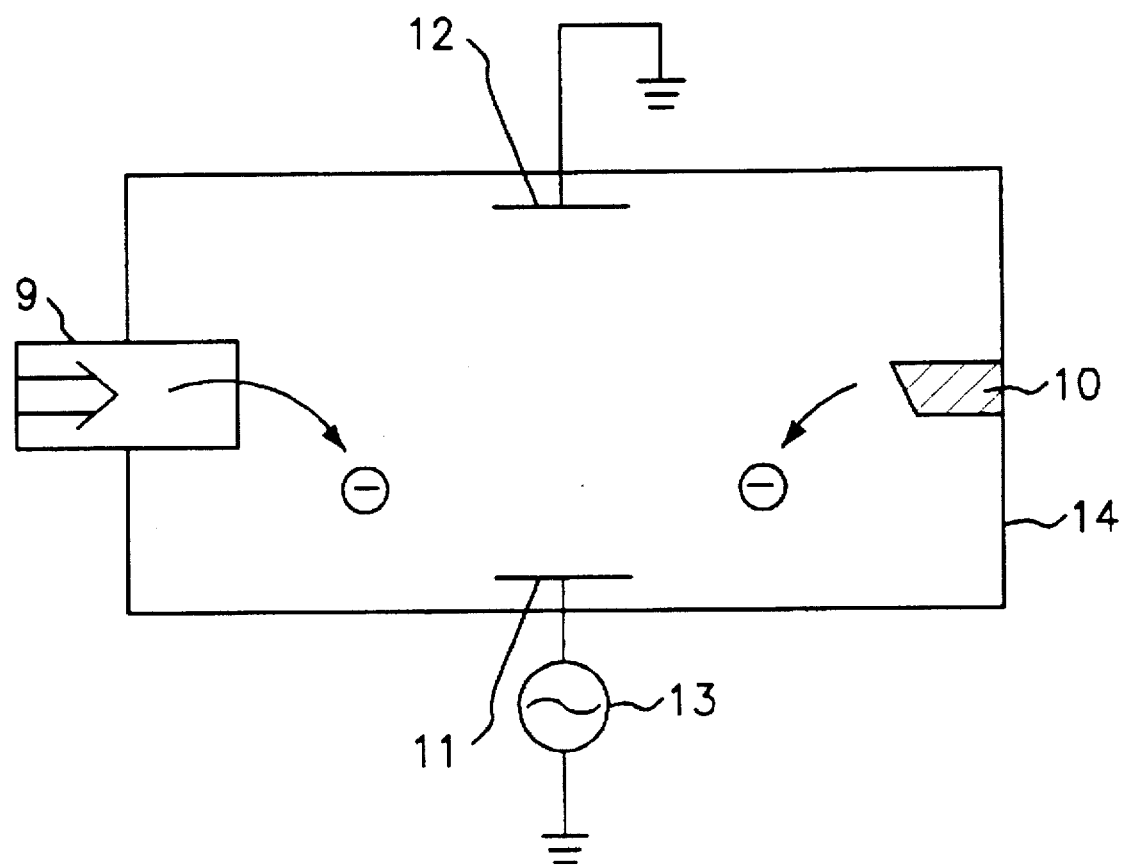
FIG. 3 is a schematic diagram illustrating electron beam-generating equipment mounted in a plasma reactor.

With reference to FIG. 3, there is a diagram showing electron beam-generating equipment wherein reference numeral "9" stands for an electron gun, "10" for a secondary electron target, "11" for a lower electrode, "12" for an upper electrode, "13" for an RF source, "14" for a plasma reactor. As shown in this figure, electron beams are injected either directly from the electron gun or indirectly using the secondary electron target. The wafer is placed on the lower electrode 11.

Considering the tens Å of thickness of gate oxide film, required for the high integration of a semiconductor device, the accumulation of the plasma ion charges becomes more and more serious. As described hereinbefore, this problem can be clearly solved using a relatively simple method in accordance with the present invention, thereby securing the reliability in highly integrated semiconductor devices.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A method for fabricating a gate electrode in a semiconductor device, said method comprising the steps of:

forming a gate insulating layer on a semiconductor substrate;

forming a conducting layer for a gate electrode on said gate insulating layer;

patterning said conducting layer using a plasma etching process; and injecting anions onto said patterned conducting layer so that said anions neutralize cations remaining on said patterned conducting layer, whereby said anions prevent said gate insulating layer from deteriorating.

2. A method in accordance with claim 1, wherein said anions come from an electron beam-generator mounted in a plasma reactor where said plasma etching process is carried out.

3. A method in accordance with claim 2, wherein said electron beam-generator comprises a first electron gun which directly generates electrons and a second electron gun which indirectly generates electrons.

4. A method in accordance with claim 3, wherein said second electron gun generates said anions from an electron target material.

* * * * *